United States Patent [19]
Cutler et al.

[11] 3,953,840
[45] Apr. 27, 1976

[54] MAGNETO RESISTIVE BUBBLE DETECTION DEVICE

[75] Inventors: Leonard S. Cutler, Los Altos Hills; Richard A. Baugh, Palo Alto, both of Calif.

[73] Assignee: Hewlett-Packard Company, Palo Alto, Calif.

[22] Filed: May 13, 1974

[21] Appl. No.: 469,169

[52] U.S. Cl................ 340/174 EB; 340/174 TF; 340/174 DA
[51] Int. Cl.²........................................ G11C 11/14
[58] Field of Search............... 340/174 TF, 174 SR, 340/174 EB, 174 DA

[56] References Cited
UNITED STATES PATENTS

| | | | |
|---|---|---|---|
| 3,702,995 | 11/1972 | Bobeck et al................ | 340/174 EB |
| 3,713,120 | 1/1973 | Bobeck et al................ | 340/174 EB |
| 3,813,660 | 5/1974 | Buhrer......................... | 340/174 EB |
| 3,820,089 | 6/1974 | Lama........................... | 340/174 EB |

*Primary Examiner*—Stanley M. Urynowicz, Jr.
*Attorney, Agent, or Firm*—Ronald E. Grubman

[57] ABSTRACT

A differential detection device is provided for detecting the presence of magnetic bubbles in a data stream circulating on a magnetic wafer. The device utilizes an array of columns of permalloy elements to enlarge the magnetic bubbles being detected. A change in resistance of each of a pair of adjacent permalloy columns as a bubble traverses the detector is sensed and differentially detected to signify the presence of the bubble. In one embodiment of the invention, a second detector is used in conjunction with the first detector to provide operation in a mode in which bubbles in alternate positions in the data stream are directed into alternate channels including the first and second detectors respectively. After detection, the bubbles are redirected into a single data stream, while the output signals from the two detectors are merged to produce a data output signal reproducing the original data stream.

9 Claims, 3 Drawing Figures

MAGNETO RESISTIVE BUBBLE DETECTION DEVICE

BACKGROUND OF THE INVENTION

This invention is concerned generally with magnetic bubble devices, and more particularly with a differential detection device for sensing the presence or absence of a magnetic bubble in a stream of bubbles.

A magnetic bubble detection device known in the art is an expander detector which utilizes the magnetoresistive effect in ferromagnetic materials such as permalloy to detect the presence of a magnetic bubble. Typically, an expander detector consists of a number of permalloy elements arranged to distort the cylindrical shape of a magnetic bubble incident on the expander into a more elongated configuration. The expansion of the bubble is accomplished by positioning a number of distinct columns of permalloy elements (typically chevron-shaped elements) in a triangular arrangement on a magnetic wafer which supports the magnetic bubbles. Under the influence of an applied rotating magnetic field, magnetic bubbles in a data stream are induced to propagate under the expander. The first permalloy column which a bubble encounters includes only a few chevrons, while succeeding columns are of increasing length so that as the bubble propagates under the device it is stretched out by magnetic interaction with the lengthening columns. Detection is accomplished by sensing the electrical resistance of one of the longer permalloy columns. When an elongated magnetic bubble passes under the detector, the resistance of the detection column is altered by interation of the bubble field with the fields of the permalloy elements, thereby indicating the presence of a bubble. The bubble then continues propagating across a sequence of permalloy columns of decreasing length to return the bubble to its original cylindrical shape, whereupon it may propagate back into the data stream. The overall device, then, is a triangular-shaped array of permalloy elements which distorts a bubble into an elongated shape, so that the elongated bubble passing under one column of permalloy elements can be detected, after which the bubble is reformed into its original shape and returned to the data stream.

It has been a problem with expander detectors known in the prior art to achieve a high signal-to-noise ratio in the detector output. The noise in the output appears to have various components. Of some importance is "switching noise," generated by random switching of magnetic domains in the permalloy elements of the detector. The switching noise is thus proportional to the square root of the number of permalloy chevrons in a series column. Since the signal is directly proportional to the number of chevrons in the column, it has been the practice to increase the signal-to-noise ratio in prior detectors by using a large number of chevrons in the detection column; for example, expander detectors having a central column consisting of about 300 chevrons are used in the art. The use of large detectors, however, occupies a correspondingly large area on the magnetic wafer, some of which could otherwise be utilized for data storage in the form of circulating bubble streams.

Another source of noise is magnetic flux pick-up on the electrical connections between the detector and the electronic amplifying circuits used to produce an output signal. This flux pick-up noise typically occurs at the frequency of the applied rotating magnetic field used to propagate the magnetic bubbles around the wafer.

SUMMARY OF THE INVENTION

In accordance with the illustrated preferred embodiments, the present invention provides a magnetic bubble expander detector on a magnetic wafer. According to the invention, the electrical resistance of each of two adjacent permalloy columns is sensed to detect the presence of a magnetic bubble passing under the detector. The columns are electrically interconnected as the two variable elements of a Wheatstone bridge whose unbalance is detected by a differential amplifier. When a magnetic bubble passes sequentially under the two detection columns, the differential amplifier produces an output signal whose waveform is essentially a positive pulse followed by a negative pulse spaced apart in time by precisely one clock cycle of a rotating magnetic field used to propagate bubbles around the wafers. Signal processing circuitry is provided to sense and temporarily store the voltage level at a selected point on the positive pulse. Precisely one clock cycle later, the voltage level of a point on the negative pulse is sensed and an output signal produced which is the difference of the two sensed voltage levels. The output signal amplitude is therefore twice the amplitude that would result from the use of a single detection column, while the noise voltage is increased only by $\sqrt{2}$, resulting in an increased signal-to-noise ratio. Furthermore, since the output results from a subtraction of two voltage levels measured one clock cycle apart, flux pick-up noise occurring at the clock frequency tends to be cancelled out; again contributing to a higher signal-to-noise ratio.

A further advantage of the invention results from the position of the two detection columns directly adjacent one another in a single expander; it is thus assured that the pair are resistance matched, i.e., that they have very similar intrinsic properties. Consequently, any DC drift induced by temperature gradients or other problems due to long-term aging will tend to be offset in the differential detection. The need for external DC balance adjustments is therefore eliminated, which is of great importance in applications where all the electronics is to be contained in one integrated circuit.

In accordance with one embodiment of the invention, only every other position in the data stream may be occupied by a bubble. An expanded bubble may therefore be present only on alternate permalloy columns in the expander detector, so that difficulties encountered in prior art detectors due to coupling between bubbles on adjacent columns are eliminated. More particularly, in prior art devices the coupling between adjacent bubbles tended to induce shrinkage or popping of a bubble in the center of a stream, particularly when a high D.C. magnetic bias field was applied to the chip. The elimination of this problem in the present invention allows the use of wide operating ranges of bias magnetic field and rotating drive magnetic field.

In accordance with another embodiment of the invention, a second expander detector identical to the first is used to detect those bubbles which have been depopulated from the string of bubbles incident on the first detector. Although each detector is only half populated with bubbles, the data from the two detectors may be electronically interleaved to produce an output

DETAILED DESCRIPTION OF THE INVENTION

Figure 1:
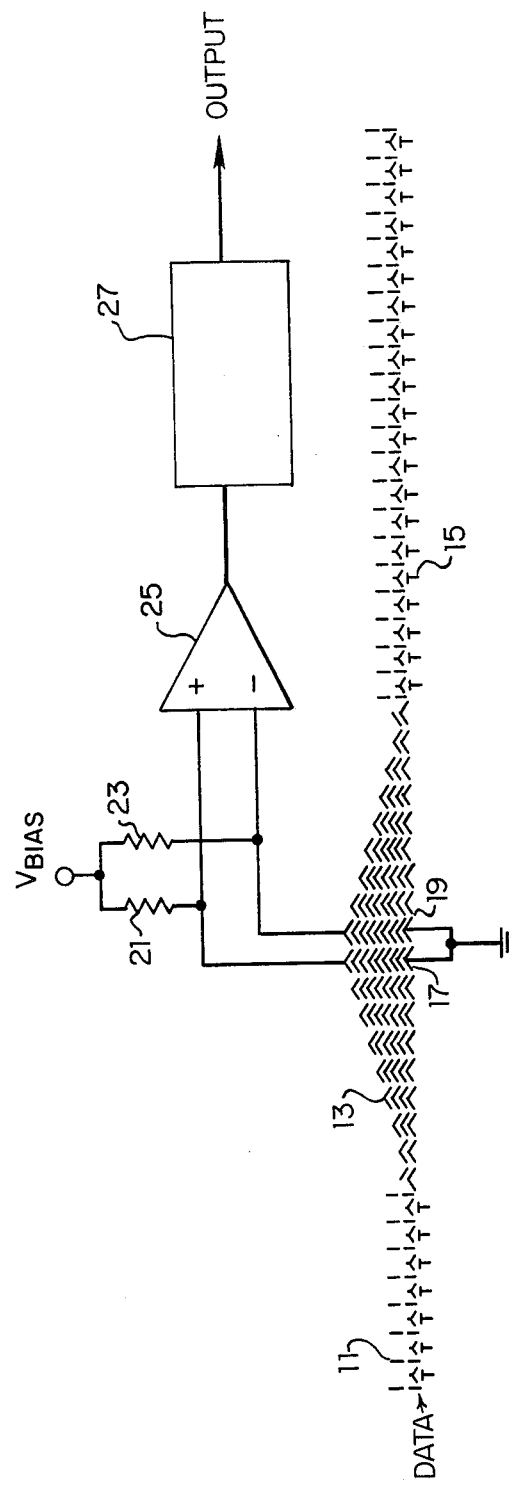
FIG. 1 illustrates a magnetic bubble differential detection device according to one embodiment of the invention.

In FIG. 1 there is shown a section 11 of a track for propagating magnetic bubbles on a magnetic wafer. Various types of propagating tracks are known in the art, the common feature being that such tracks are fabricated from a highly permeable magnetic material such as permalloy. A particularly efficient track configuration is disclosed in U.S. Patent application Ser. No. 345,050 filed Mar. 26, 1973 by Richmond B. Clover, Jr., now U.S. Pat. No. 3,848,239, and assigned to the same assignee as the present application. In operation, magnetic bubbles of a stable diameter are maintained on the wafer under the influence of an applied bias magnetic field. The bubbles are made to circulate on the track by the application to the magnetic wafer of an external rotating magnetic field, a process well known in the art and described in the above-mentioned patent application. For purposes of example, it will be assumed that an external rotating magnetic field is propagating data in the form of a stream of magnetic bubbles from left to right on track 11. In some detecting arrangements, the data stream itself may not be directly detected, but instead the data stream is replicated by bubble generation techniques well known in the art. It is to be references that reference herein to a data stream to be detected encompass also a stream of bubbles so replicated. Magnetic bubbles in this stream will be incident from the left on a magnetic bubble expander device 13. Expander 13 consists of a sequence of columns of elements of a highly permeable magnetic material such as permalloy which in the figure are illustrated as being chevron-shaped. A bubble entrant on expander 13 at the left first encounters a chevron column consisting of only a few permalloy elements. However, as the bubble propagates to the right under the influence of the rotating magnetic field it traverses columns having increasing numbers of chevrons. Under the influence of these increasingly lengthy columns, the cylindrical bubble is distorted into an elongated shape having a maximum extension under the chevron column of maximum length, there being two such columns labeled 17 and 19 illustrated in the figure. After the bubble passes the maximum length columns, it begins to shrink as it progresses to the right, finally returning to its original cylindrical shape and thence propagating back into the data stream on another track section labelled 15. (Note that if the bubbles to be detected are replicated from a data stream as described above it is unnecessary to preserve the bubbles after detection, since the original data stream is preserved.)

According to the present invention, the presence of a bubble in the stream is detected by a change in the electrical resistance of each of the pair of adjacent chevron columns 17 and 19 when the elongated magnetic bubble passes under these columns. In accordance with the invention, detection columns 17 and 19 are electrically interconnected as the two variable elements of a Wheatstone bridge arrangement with fixed resistors 21 and 23. A differential amplifier 25 responds to any unbalance in the Wheatstone bridge. Thus, as a bubble passes from left to right under columns 17 and 19, respectively, amplifier 25 will first generate a positive pulse as the bubble passes under column 17 while a negative pulse of similar amplitude will subsequently be generated when the bubble passes column 19. Since the bubble propagates from one column to an adjacent column in one period of the applied rotating magnetic field, it may be seen that the two pulses will be separated by exactly one period of the rotating field. This "doublet" signal output of amplifier 25 is then applied at the input of a signal processing network 27 which functions to sense and temporarily store a voltage level on the positive pulse. Precisely one clock cycle later, signal processing network 27 senses the voltage level on the negative pulse producing an output signal which is the difference of the two sensed voltages to indicate the presence of a bubble. This detection scheme ensures that any noise at the clock frequency (e.g. noise present on the output due to coupling of flux from the external rotating magnetic field) will be cancelled out.

Figure 2:
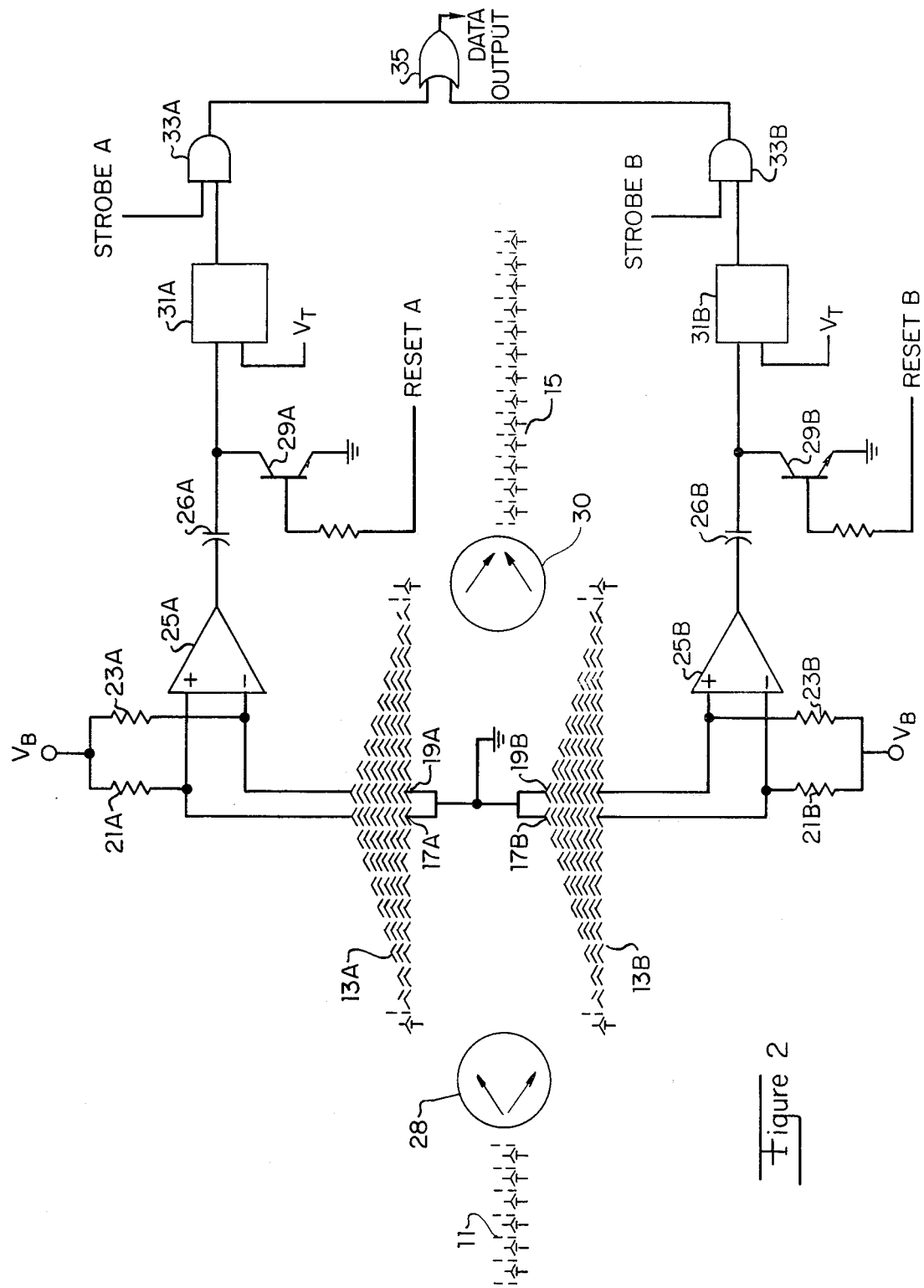
FIG. 2 illustrates another embodiment of the invention using a pair of bubble expanders.

The operation of a particular embodiment of a signal processing network such as network 27 will be described in detail below in connection with the embodiment of FIG. 2. However, from the discussion above it is evident that the amplitude of the difference signal can be as much as twice that of either half of the doublet signal. The use of a pair of detection columns thus contributes to an increased signal-to-noise ratio which in prior art detectors using a single column detector would require a bubble expander occupying a much greater area on the wafer than that required by the present invention. Although at present, some expansion of the bubble domains is still required to produce an acceptable signal level, the possible future development of better materials for supporting magnetic bubbles might make possible detection with little or not expansion. The use of a time-separated doublet detection scheme as described above could, of course, also be applied to detection with little or no expansion, and might even make expansionless detection possible in materials which would otherwise require expansion.

It should be noted at this point that the operation of the device as described above is most effective when the data stream of bubbles incident on expander 13 is depopulated in every other position, i.e., when magnetic bubbles may only appear in the stream in alternate positions. Operation in this mode insures that the difference between the positive signal output when a bubble passes under detector 17 and a negative signal output when the same bubble passes under detector 19 will be a single non-zero pulse, thereby definitely indicating the presence of a bubble. If, on the other hand, several adjacent bubble positions were all populated, then a positive pulse would appear when the first bubble was incident on detector 17 while a negative pulse would appear only when the last bubble traversed detector 19. Intermediate these pulses will appear a zero output, the difference between a positive pulse due to one bubble and a negative pulse from an adjacent bubble on the adjacent detector. In this mode (without depopulation) to make an unambiguous determination of whether a zero output represents the absence of a bubble, or the presence of one bubble in a string requires that signal processor 27 include means for storing an additional piece of information.

In practice, operation will more often be in the depopulated mode. For example, it is customary in the art to utilize expander detectors in a major/minor loop system in which data is stored in parallel in a sequence of "minor" storage loops. This data is transferred in parallel (e.g. by replication) to a "major" loop including the detector. It is a simple operation to transfer the data into the major loop such that it occupies only every other portion in the major loop track, thereby accomplishing the depopulation required for operation in that mode. Operation in the depopulated mode has the advantage that bubbles are never simultaneously present on directly adjacent columns of expander 13. This eliminates the possibility of a bubble which is between two other bubbles being distorted or popped by mutual interaction among the magnetic fields of the various bubbles. In a depopulated mode, bubbles may be present in only every other position in the data stream. Operation in this mode therefore yields a data read-output rate of one-half the basic circulating rate of the data. An increased read-out rate equal to the circulating data rate may be produced in accordance with the embodiment of the invention illustrated in FIG. 2. To facilitate understanding of the embodiment shown in FIG. 2, reference will also be made to FIG. 3 which shows in chronological sequence the various voltages and signals appearing through the device during typical operation.

Figure 3:
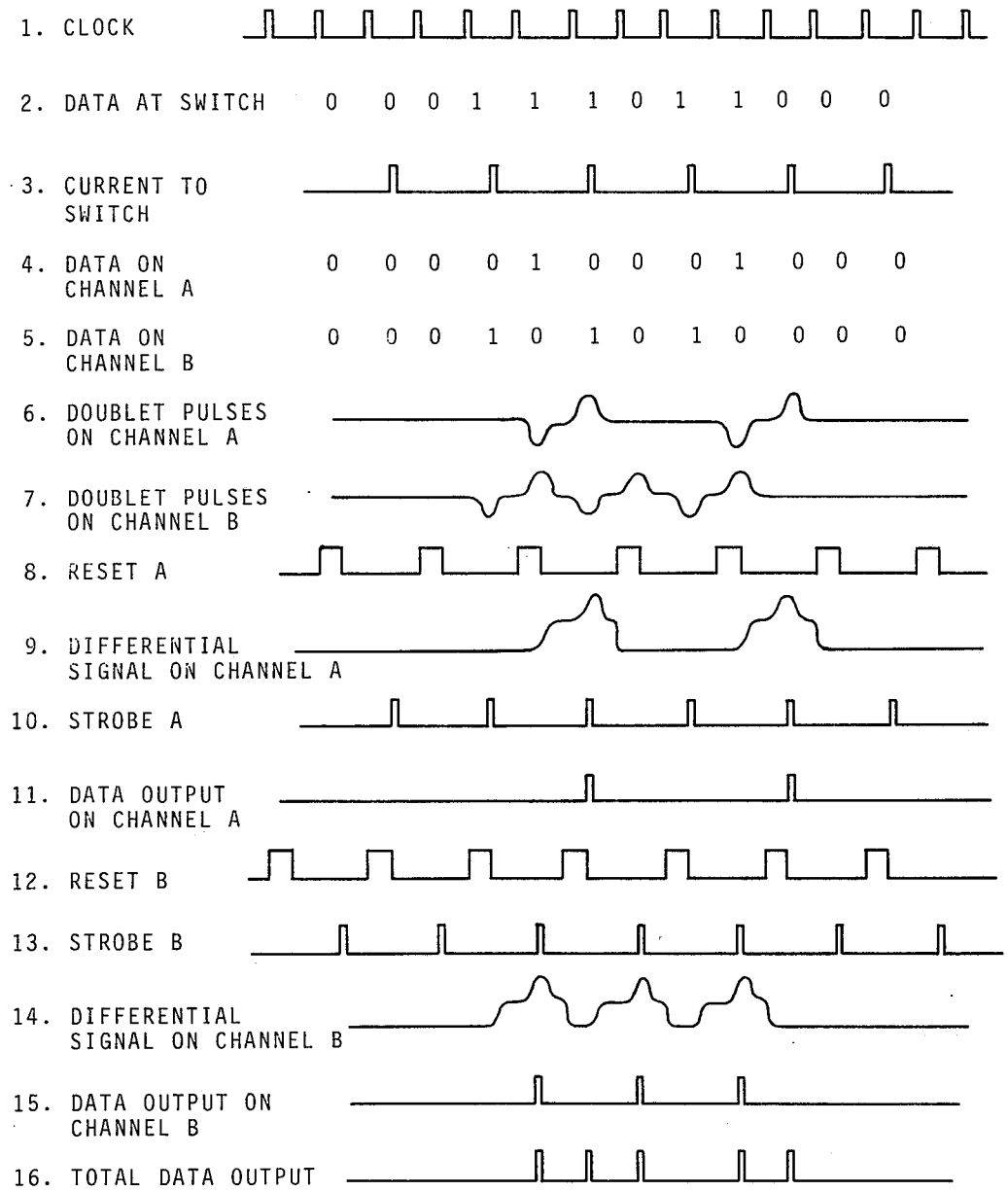
FIG. 3 is a timing diagram illustrating the operation of the device of FIG. 2.

In FIG. 2 there is again illustrated a magnetic bubble propagating track 11. Magnetic bubbles propagate through one period of this track during one cycle of the applied rotating drive magnetic field. The period of the rotating magnetic field thus determines the basic clock period of the device, which is illustrated in row 1 of FIG. 3. Directly adjacent to propagating track 11 is a magnetic bubble switch 28 which operates to direct magnetic bubbles incident thereon onto an upper path or a lower path. Bubble switch 28 may be any of a number of such switches known to those skilled in the art; one example is a current operated switch disclosed in U.S. Patent application Ser. No. 386,671 filed Aug. 8, 1973 by Richmond B. Clover, Jr. and Robert F. Waites and assigned to the same assignee as the present application. Typically, bubbles incident on switch 28 will be deflected onto one path when the switch is in an inactive state and deflected onto the other path when the switch is actived, for example, by the application of a current pulse. In the present embodiment of the invention, the magnetic bubble switch 28 is activated once during every other clock cycle of operation, as illustrated by row 3 of FIG. 3. A typical data sttream on track 11 is illustrated in row 2 of FIG. 3, in which a "1" signifies the presence of a magnetic bubble in the stream while a "0" signifies the absence of such a bubble. When this data stream is incident on bubble switch 28, bubbles present in alternate positions in the stream will be diverted onto a first channel "A" including a magnetic bubble expander 13A, while the bubbles in the remaining alternate positions will be diverted onto a second channel "B" including an identical expander 13B. Hereafter, correspondig numerals will be used to label corresponding elements in the two channels, elements of channel "A" being designated by an "A" following the numerals and elements of channel "B" being designated by a "B" following the numerals. Rows 4 and 5 of FIG. 3 illustrate the data streams which will be deflected into channels A and B respectively. In an alternate mode, the data stream may be replicated as described above in connection with the device of FIG. 1, with the added feature that bubbles replicated from alternate positions in the data stream are directed to alternate channels for detection. If this procedure is followed original data need not be switched. It is again to be understood then, that references to bubbles to be detected include both bubbles in a data stream or bubbles replicated from a data stream.

As was described above in connection with FIG. 1, a bubble traversing expander 13A will be distorted from its original cylindrical shape into an elongated shape. The presence of this bubble in the stream on channel A is detected by a pair of detectors 17A and 19A connected in a Wheatstone bridge arrangement with a pair of resistors 21A and 23A and a differential amplifier 25A. An exactly similar detection of bubbles present in channel B takes place when an expanded bubble transverses detectors 17B and 19B connected in a Wheatstone bridge arrangement with resistors 21B, 23B and a differential amplifier 25B. For the particular data illustrated in rows 4 and 5 of FIG. 3, the output of amplifier 25A is illustrated in row 6 of FIG. 3. The output comprises a sequence of doublet pulses, one doublet pulse corresponding to each occurrence of a single bubble passing sequentially under detectors 17A and 19A. Row 7 shows a sequence of doublet pulses corresponding to the bubbles passing under detectors 17B and 19B in channel B. After the magnetic bubbles in each channel have traversed the bubble expander in that channel, they are merged into a single data stream on a propagating track 15 by means of another bubble switch 30. (If the detected bubbles have been replicated from a data stream, then it is unnecessary to recombine or even preserve the bubbles after detection, since the original stream is preserved. In that case, no switching is required.)

To provide an optimum signal-to-noise ratio in the detector output, each channel of the illustrated device incorporates signal processing circuitry to sense a pair of voltage levels on the doublet pulse precisely one clock cycle apart, and produce an output signal when the difference of the two sensed voltages exceeds a present threshold voltage. This comparison may be achieved, for example, using the circuitry illustrated in FIG. 2. According to the embodiment of FIG. 2, the signal processing circuitry includes a capacitor 26A functioning as an analog memory. The capacitor may be shorted to ground through a transistor reset switch 29A. As illustrated e.g. by row 8 of FIG. 3, switch 29A is opened at a predetermined phase once every other clock cycle, allowing the capacitor to charge in response to the doublet output of amplifier 25A. This arrangement functions as an analog memory, so that a doublet voltage (such as that illustrated in row 6 of FIG. 3) appearing at the output of amplifier 25A will produce a signal such as that illustrated in row 9 of FIG. 3 at the output side of capacitor 26A. Any noise occurring at the clock frequency will be absent from the second portion of this signal. This voltage is applied as one input of a standard voltage comparator 31A. Comparator 31A operates to compare the signal pulse at its input with a threshold voltage $V_T$, an outpput signal being generated when the signal voltage exceeds the threshold voltage. According to the invention, the signal-to-noise ratio may be further enhanced by sampling the waveform to produce a signal output only during a predetermined part of the clock cycle. This is accomplished by directing the output of comparator 31A to one input of an AND gate 33A. The other input of AND gate 33A is a "strobe A" signal which determines a precise time interval during a clock cycle when AND gate 33A will be activated, thereby enabling an output signal to be produced if one is present on the input from comparator 31A. Thus, if it is known that a high signal-to-noise ratio is more likely to be obtained from the detected signal during a certain portion of a clock cycle, AND gate 33A may be strobed during the desired phase of the cycle. Row 10 of FIG. 3 illustrates a strobe input applied to AND gate 33A at that point in a clock cycle where the maximum signal-to-noise is expected. For optimum rejection of flux pick-up noise, the strobing point should occur one clock cycle after switch 29A is opened. Row 11 of FIG. 3 illustrates the data signal output from AND gate 33A in response to the bubble stream traversing that channel.

An exactly similar operation to that just described takes place with respect to magnetic bubbles traversing channel B. Rows 12 and 13 of FIG. 3 show the reset and strobe timing for channel B, while row 14 illustrates the input to a voltage comparator 31B in that channel. Row 15 of FIG. 3 shows the data output from AND gate 33B. Finally, the data from channels A and B is merged in an OR gate 35 to produce a final data stream such as that illustrated in row 16 of FIG. 3. It may be seen that by utilizing two identical channels, and merging the final data output, the device retains all the advantages of operation on a depopulated data stream while yet preserving the optimum data detection rate dictated by the basic clock frequency of the drive magnetic field.

We claim:

1. A device for detecting magnetic bubbles propagating in a stream on a magnetic wafer in response to an applied rotating magnetic field, said device comprising:
   first expander means including a first plurality of magnetic elements for elongating the shape of magnetic bubbles to be detected and guiding the magnetic bubbles along a detection channel;
   first and second detection means for producing a doublet electrical signal having different portions separated in time in response to an elongated magnetic bubble to be detected, said first and second detection means including a pair of adjacent elements of said first plurality of magnetic elements; and
   first signal processing means electrically interconnected with said first and second detection means for comparing two voltage levels on said different portions of said doublet electrical signal and generating a data output signal whenever the difference between the two voltage levels exceeds a predetermined level.

2. A device as in claim 1 wherein:
   said first and second detection means produce a doublet electrical signal having a positive portion and a negative portion; and
   said first signal processing means operates to sense and store a voltage level on one of said positive and negative portions, to sense another voltage level on the other of said positive and negative portions, and to generate a data output signal whenever the difference of the two voltage levels exceeds a predetermined level, the two sensed voltage levels being separated in time by one period of the applied rotating magnetic field.

3. A device as in claim 2 wherein said first and second detection means further include a pair of resistive elements electrically interconnected in a Wheatstone bridge configuration with said pair of magnetic elements of said first plurality of expander elements, for detecting changes in electricl resistance of said pair of magnetic elements in response to magnetic bubbles coming into proximity with the said elements.

4. A device as in claim 3 wherein said first plurality of magnetic elements includes a sequence of columns of chevron-shaped elements, successive ones of said columns having increasing numbers of chevron-shaped elements up to a predetermined number and having decreasing numbers of elements thereafter.

5. A device as in claim 1 further including:
   second expander means including a second plurality of magnetic elements for elongating the shape of magnetic bubbles to be detected and guiding the magnetic bubbles along a detection channel;
   third and fourth detection means for producing another doublet electrical signal having different portions separated in time in response to a magnetic bubble to be detected, said third and fourth detection means including a pair of elements of said second plurality of magnetic elements;
   second signal processing means electrically interconnected with said third and fourth detection means for comparing two voltage levels on different portions of said other doublet electrical signal and generating a data output signal whenever the difference between these two voltage levels exceeds a predetermined level; and
   combining means for merging the data output signals from said first and second signal processing means to produce a combined data output signal.

6. A device as in claim 5 wherein:
   said first and second detection means produce a doublet electrical signal having a positive portion and a negative portion:
   said first signal processing means operates to sense and store a voltage level on one of said positive and negative portions, to sense another voltage level on the other of said positive and negative portions, and to generate a data output signal whenever the difference of the two voltage levels exceeds a predetermined level, the two voltages sensed by said first signal processing means being separated in time by one period of the applied rotating magnetic field;
   said third and fourth detection means produce another doublet electrical signal having a positive portion and a negative portion; and
   said second signal processing means operates to sense and store a voltage level on one of said last named positive and negative portions, to sense another voltage level on the other of said last named positive and negative portions, and to generate a data output signal whenever the difference of these two last named voltage levels exceeds a predetermined level, the two voltages sensed by said second signal processing means being separated in time by one period of the applied rotating magnetic field.

7. A device as in claim 6 wherein:

said first and second detection means further include a pair of resistive elements electrically interconnected in a Wheatstone bridge configuration with said pair of elements of said first plurality of magnetic elements; and said third and fourth detection means further include another pair of resistive elements electrically interconnected in a bridge configuration with said pair of elements of said second plurality of magnetic elements.

8. A device as in claim 7 wherein each of said first and second pluralities of magnetic elements of said first and second expander means includes a sequence of columns of chevron-shaped elements, successive ones of said columns having increasing numbers of chevron-shaped elements up to a predetermined number, and having decreasing numbers of elements thereafter.

9. A device as in claim 8 further including:

first magnetic bubble switching means interconnected with said first and second expander means for directing magnetic bubbles in alternate positions of said stream onto said first and second expander means respectively; and second magnetic bubble switching means interconnected with said first and second expander means for recombining said directed magnetic bubbles into a combined stream.

* * * * *